US012730698B2

(12) United States Patent
Chen et al.

(10) Patent No.: US 12,730,698 B2
(45) Date of Patent: Sep. 8, 2026

(54) ERROR DETECTION AND CORRECTION METHOD AND CIRCUIT

(71) Applicant: UPBEAT TECHNOLOGY Co., Ltd, New Taipei City (TW)

(72) Inventors: Chung-Chieh Chen, New Taipei City (TW); Da-Ming Chiang, New Taipei City (TW); Shuo-Hong Hung, New Taipei City (TW); Bing-Chen Wu, New Taipei City (TW)

(73) Assignee: UPBEAT TECHNOLOGY Co., Ltd, New Taipei City (TW)

(*) Notice: Subject to any disclaimer, the term of this patent is extended or adjusted under 35 U.S.C. 154(b) by 102 days.

(21) Appl. No.: 18/948,491

(22) Filed: Nov. 15, 2024

(65) Prior Publication Data

US 2025/0068497 A1 Feb. 27, 2025

Related U.S. Application Data

(62) Division of application No. 17/858,810, filed on Jul. 6, 2022, now Pat. No. 12,189,460.

(60) Provisional application No. 63/218,522, filed on Jul. 6, 2021.

(30) Foreign Application Priority Data

Nov. 8, 2021 (TW) ................................ 110141502

(51) Int. Cl.

| | |
|---|---|
| ***G06F 11/07*** | (2006.01) |
| ***G06F 11/10*** | (2006.01) |
| ***H03K 3/037*** | (2006.01) |

(52) U.S. Cl.

CPC ...... *G06F 11/0757* (2013.01); *G06F 11/0721* (2013.01); *G06F 11/0772* (2013.01); *G06F 11/1048* (2013.01); *H03K 3/0372* (2013.01)

(58) Field of Classification Search

CPC ............. G06F 11/1048; G06F 11/0757; G06F 11/0721; G06F 11/0772; H03K 3/0372

USPC .......... 714/724, 731, 735, 742, 744, 763, 34

See application file for complete search history.

(56) References Cited

U.S. PATENT DOCUMENTS 4,597,061 A * 6/1986 Cline .................. G06F 12/0215 365/189.11
5,151,896 A * 9/1992 Bowman ............... H04M 9/025 370/401
5,321,702 A * 6/1994 Brown ............... G01R 31/3191 714/744
6,233,707 B1 * 5/2001 Potter ...................... G11C 8/10 714/724
6,539,454 B2 * 3/2003 Mes ..................... G11C 7/1039 711/105

(Continued)

OTHER PUBLICATIONS

Ernst et al., Razor: A Low-Power Pipeline Based on Circuit-Level Timing Speculation, 2003, IEEE, pp. 1-12 (Year: 2003).

*Primary Examiner* — John J Tabone, Jr.
(74) *Attorney, Agent, or Firm* — Innovation Counsel LLP

(57) ABSTRACT

An error detection and correction method is provided. The method includes: when a pipeline stage error is detected, correcting the pipeline stage error; when it is determined that a plurality of cascaded pipeline stage circuits have continuous pipeline stage errors, stopping all operations of all pipeline stage circuits; flushing the data of the pipeline stage circuits; and re-processing the data of the pipeline stage circuits at a downclocked frequency.

8 Claims, 13 Drawing Sheets

(56) References Cited

U.S. PATENT DOCUMENTS 8,222,943 B2 * 7/2012 Sood .................. H03K 3/35625
327/203
8,369,477 B2 * 2/2013 Shibayama .......... H03K 21/023
377/47
9,304,531 B2 * 4/2016 Harris ................... G06F 1/3296
9,413,373 B1 * 8/2016 Ishii .................... H03M 1/1061
9,798,599 B2 * 10/2017 Parthasarathy ...... H03K 3/0375
12,189,460 B2 * 1/2025 Chen ................... G06F 11/0772
2003/0065900 A1 * 4/2003 Mes ..................... G11C 7/1039
711/169
2006/0005091 A1 * 1/2006 Mitra ............. G01R 31/318566
714/726
2007/0168848 A1 * 7/2007 Tschanz ........... G01R 31/31937
714/798
2008/0263379 A1 * 10/2008 Tuuk ................... G06F 11/0757
713/375
2009/0315601 A1 * 12/2009 Priel ......................... H04L 7/02
327/161
2010/0251046 A1 * 9/2010 Mizuno ............ G01R 31/31725
714/724
2011/0060975 A1 * 3/2011 Pappalardo ......... G06F 11/1608
714/E11.002
2012/0098583 A1 * 4/2012 Shibayama ........... G06F 9/3869
327/276
2013/0166952 A1 * 6/2013 Schon ................... G06F 9/3861
714/E11.138
2015/0309897 A1 * 10/2015 Shan ................... G06F 11/3024
714/10
2018/0307553 A1 * 10/2018 Acharya ................ G11C 29/32
2023/0008476 A1 * 1/2023 Chen ................... G06F 11/0757
2025/0068497 A1 * 2/2025 Chen .................... H03K 3/0372

* cited by examiner

300D detection enabling circuit 360

CP

Error detection circuit 330

ERR

CP

Frequency division circuit 340 clkb clkbb

Multiplexer 350

CP

DIN

CP

Master latch circuit 310

DSAM

QINT

Slave latch circuit 320

Q

SET

RESET

SET

RESET

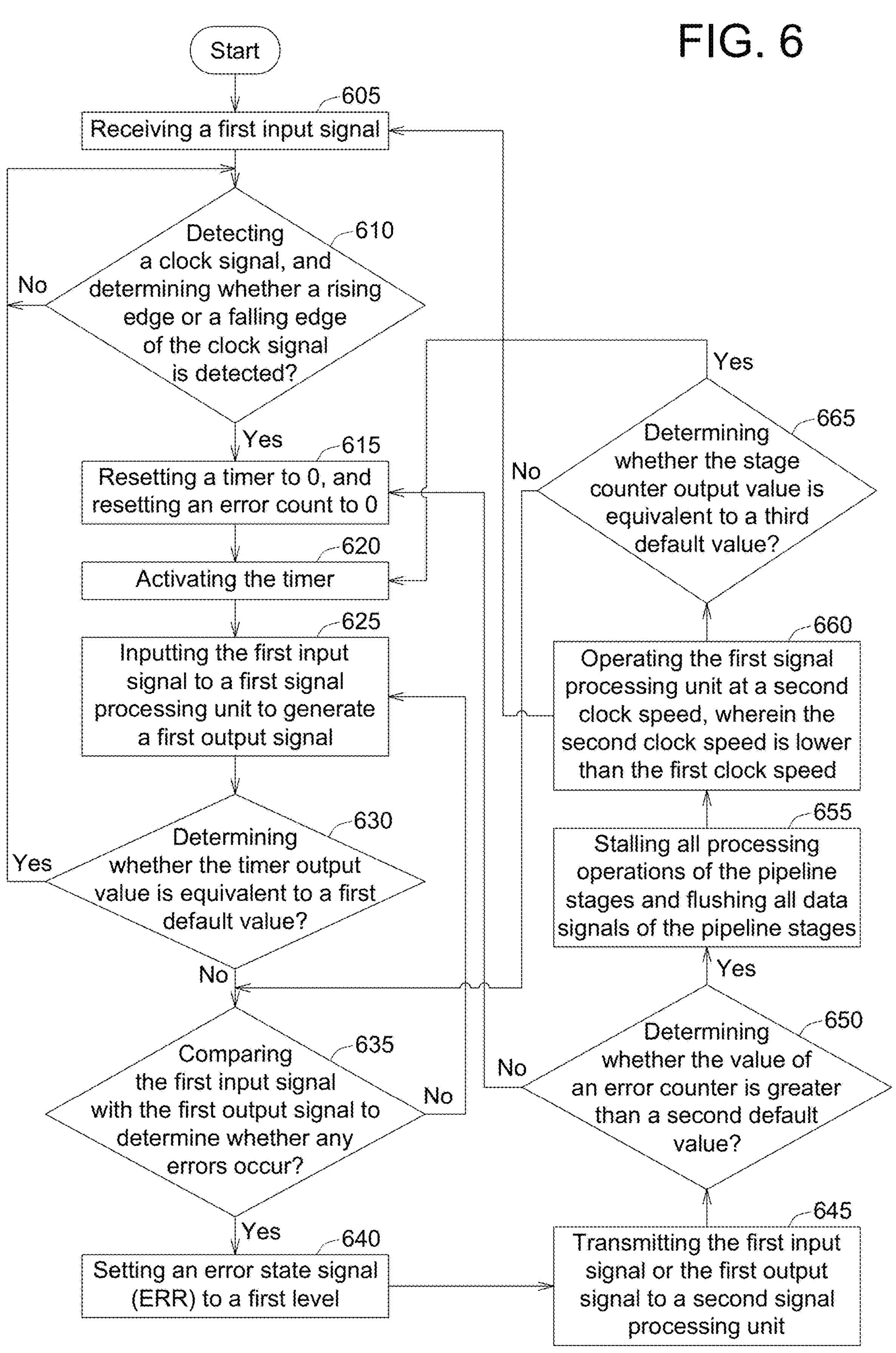
FIG. 6
Start
605
Receiving a first input signal
610
Detecting a clock signal, and determining whether a rising edge or a falling edge of the clock signal is detected?
No
Yes
615
Resetting a timer to 0, and resetting an error count to 0
620
Activating the timer
625
Inputting the first input signal to a first signal processing unit to generate a first output signal
630
Determining whether the timer output value is equivalent to a first default value?
Yes
No
635
Comparing the first input signal with the first output signal to determine whether any errors occur?
No
Yes
640
Setting an error state signal (ERR) to a first level
645
Transmitting the first input signal or the first output signal to a second signal processing unit
650
Determining whether the value of an error counter is greater than a second default value?
No
Yes
655
Stalling all processing operations of the pipeline stages and flushing all data signals of the pipeline stages
660
Operating the first signal processing unit at a second clock speed, wherein the second clock speed is lower than the first clock speed
665
Determining whether the stage counter output value is equivalent to a third default value?
Yes
No

ERROR DETECTION AND CORRECTION METHOD AND CIRCUIT

This application is a divisional application of U.S. Non-provisional patent application Ser. No. 17/858,810, filed Jul. 6, 2022, which claims the benefit of U.S. provisional application Ser. No. 63/218,522, filed Jul. 6, 2021 and Taiwan application Serial No. 110141502, filed Nov. 8, 2021, the subject matters of which are incorporated herein by reference.

BACKGROUND OF THE INVENTION

Field of the Invention

The invention relates in general to an error detection and correction method and circuit.

Description of the Related Art

Internet-of-things (IoT) smart devices have been attracting more and more attention in people's daily lives. It is essential to increase operation reliability and reduce power loss of the smart devices.

To increase operation reliability and reduce power loss, a pipeline processing architecture has been provided in the technology field of micro-processor. However, under such processing architecture, errors may come from various sources, such as process, voltage, and temperature (PVT) variations of electronic elements. To avoid errors occurring to the internal elements (such as processor) of the smart devices, an error detection and correction (EDAC) mechanism is provided. In an EDAC system, operation speed, latency, energy consumption and implementation cost are important factors to be considered.

Therefore, it has become a prominent task for the industries to provide an EDAC system that better meets the needs.

SUMMARY OF THE INVENTION

According to one embodiment of the present invention, an error detection and correction method of a pipeline stage circuit is provided. The error detection and correction method includes: (a) receiving a first input signal; (b) detecting a clock signal, and determining whether a rising edge or a falling edge of the clock signal is detected; if the determination result is affirmative, the method proceeding to step (c); if the determination result is negative, the method repeating step (b); (c) resetting a timer to 0; (d) activating the timer; (e) inputting the first input signal to a first signal processing unit to generate a first output signal; (f) determining whether a timer output value is equivalent to a first default value: if the determination result is affirmative, the method returning to step (b); if the determination result is negative, the method proceeding to step (g); (g) comparing the first input signal with the first output signal to determine whether any errors occur: if any errors occur, the method proceeding to step (h); if no errors occur, the method returning to step (e); (h) setting an error state signal to a first level; and (i) transmitting the first input signal or the first output signal to a second signal processing unit.

According to another embodiment of the present invention, an error detection and correction circuit is provided. The error detection and correction circuit includes: a master latch circuit configured to receive an input data and generate a sampling data; an error detection circuit coupled to the master latch circuit to compare the input data with the sampling data to generate a comparison result; a multiplexer coupled to the master latch circuit and the error detection circuit; and a slave latch circuit coupled to the multiplexer to receive a multiplexer output from the multiplexer and generate an output data, wherein, the multiplexer determines whether to output the input data or the sampling data to the slave latch circuit according to the comparison result.

According to an alternate embodiment of the present invention, an error detection and correction system is provided. The error detection and correction system includes: a pipeline circuit and a system error detection and correction circuit. The pipeline circuit, operated at a first operating frequency, includes: a first pipeline stage circuit, a first error detection and correction circuit coupled to the first pipeline stage circuit, a second pipeline stage circuit coupled to the first error detection and correction circuit, and a second error detection and correction circuit coupled to the second pipeline stage circuit. Each of the first and second error detection and correction circuits includes: a main latch circuit configured to receive an input data and generate a sampling data; an error detection circuit coupled to the main latch circuit to compare the input data with the sampling data to generate a comparison result; a multiplexer coupled to the main latch circuit and the error detection circuit; and a secondary latch circuit coupled to the multiplexer to receive a multiplexer output from the multiplexer and generate an output data, wherein, the multiplexer outputs the input data or the sampling data to the secondary latch circuit according to the comparison result. The system error detection and correction circuit, coupled to the pipeline circuit, includes: a plurality of error state reception units, each receiving an error state signal from the error detection unit; a plurality of continuous error state detection units coupled to adjacent error state reception units with continuous stages; a global system error detection unit coupled to the continuous error state detection units; and an interruption controller coupled to the global system error detection unit to interrupt and re-activate the pipeline circuit; when the continuous error state detection units detect continuous error states, the continuous error state detection units notify the global system error detection unit, the global system error detection unit stops the operations of all pipeline stage circuits through the interruption controller and flushes the data of the pipeline stage circuits, and the pipeline circuit is re-activated at a second operating frequency, wherein the second operating frequency is lower than first operating frequency.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 6 is a flowchart of an error detection and correction method of a pipeline stage circuit according to an embodiment of the present invention.

DETAILED DESCRIPTION OF THE INVENTION

Technical terms are used in the specification with reference to the prior art used in the technology field. For any terms described or defined in the specification, the descriptions and definitions in the specification shall prevail. Each embodiment of the present disclosure has one or more technical features. Given that each embodiment is implementable, a person ordinarily skilled in the art can selectively implement or combine some or all of the technical features of any embodiment of the present invention.

The error detection and correction according to an embodiment of the present invention can be implemented through circuit-level error detection and correction and system-level error detection and correction. When a single pipeline stage circuit error is detected, the single pipeline stage circuit error can be corrected through circuit-level error detection and correction. When a plurality of cascaded pipeline stage circuits are detected to have continuous pipeline stage errors (exemplarily but not restrictively, at least 2 errors are detected), system-level error correction is activated to correct the continuous pipeline stage errors. Here, “pipeline stage error” represents that error, such as time error, occurs to pipeline stage circuit of a pipeline; and, “continuous pipeline stage errors” represents that the continuous pipeline stages have errors.

Figure 1:
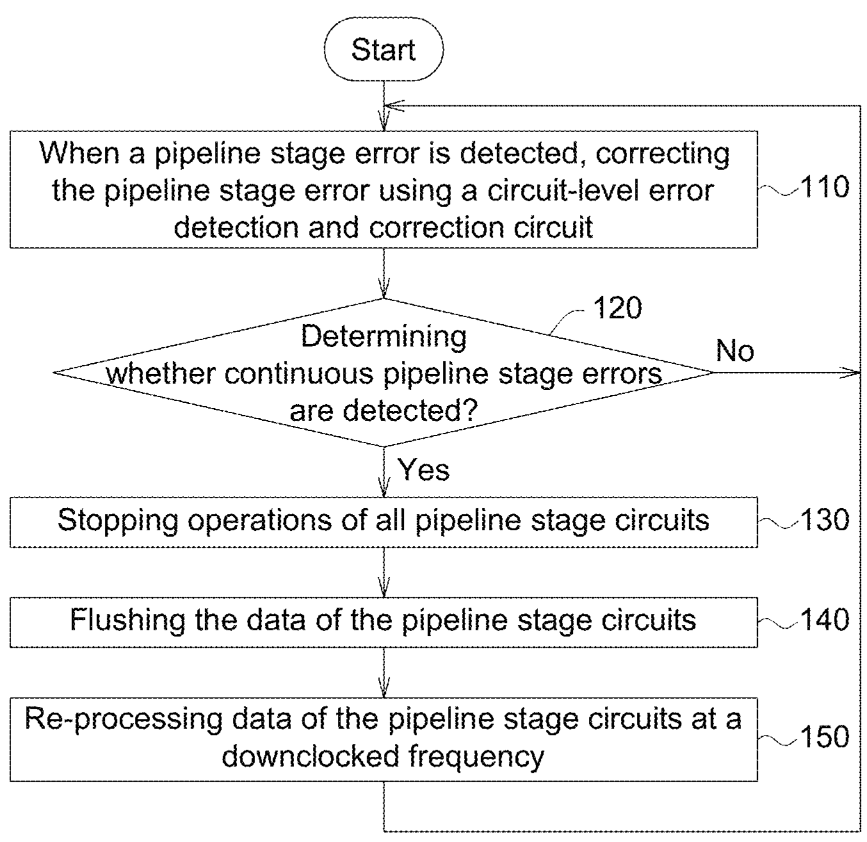
FIG. 1 is a flowchart of an error detection and correction method according to a first embodiment of the present invention.

Referring to FIG. 1, a flowchart of an error detection and correction method according to a first embodiment of the present invention is shown. As indicated in FIG. 1, in step 110, when a pipeline stage error is detected, the pipeline stage error is corrected using a circuit-level error detection and correction circuit.

In step 120, whether continuous pipeline stage errors are detected is determined. Exemplarily but not restrictively, in step 120, whether 2 continuous pipeline stages errors are detected is determined. If the determination result in step 120 is affirmative, the method continues to step 130; if the determination result in step 120 is negative, the method returns to step 120.

In step 130, the operations of all pipeline stage circuits are stopped.

In step 140, data of the pipeline stage circuits are flushed.

In step 150, data of the pipeline stage circuits are reprocessed (operated) at a downclocked frequency. In an embodiment of the present invention, the frequency can be downclocked to, exemplarily but not restrictively, a first reference value (90%) of the original frequency or lower. After downclocking, the system clock frequency is equivalent to or lower than first reference value (90%) of the original frequency of system clock.

Figure 2A:
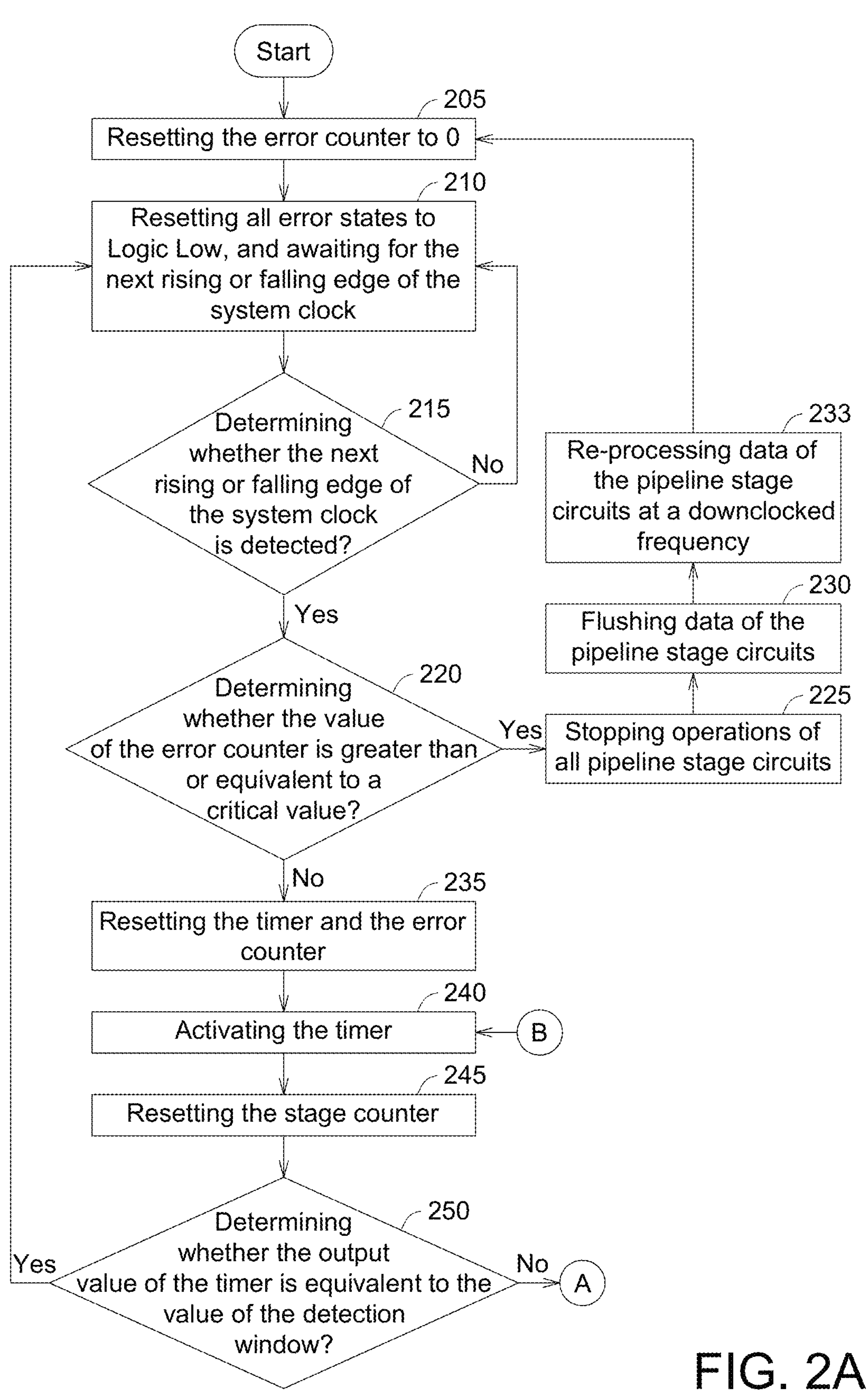
FIG. 2A and FIG. 2B are flowcharts of an error detection and correction method according to a second embodiment of the present invention.
Figure 2B:
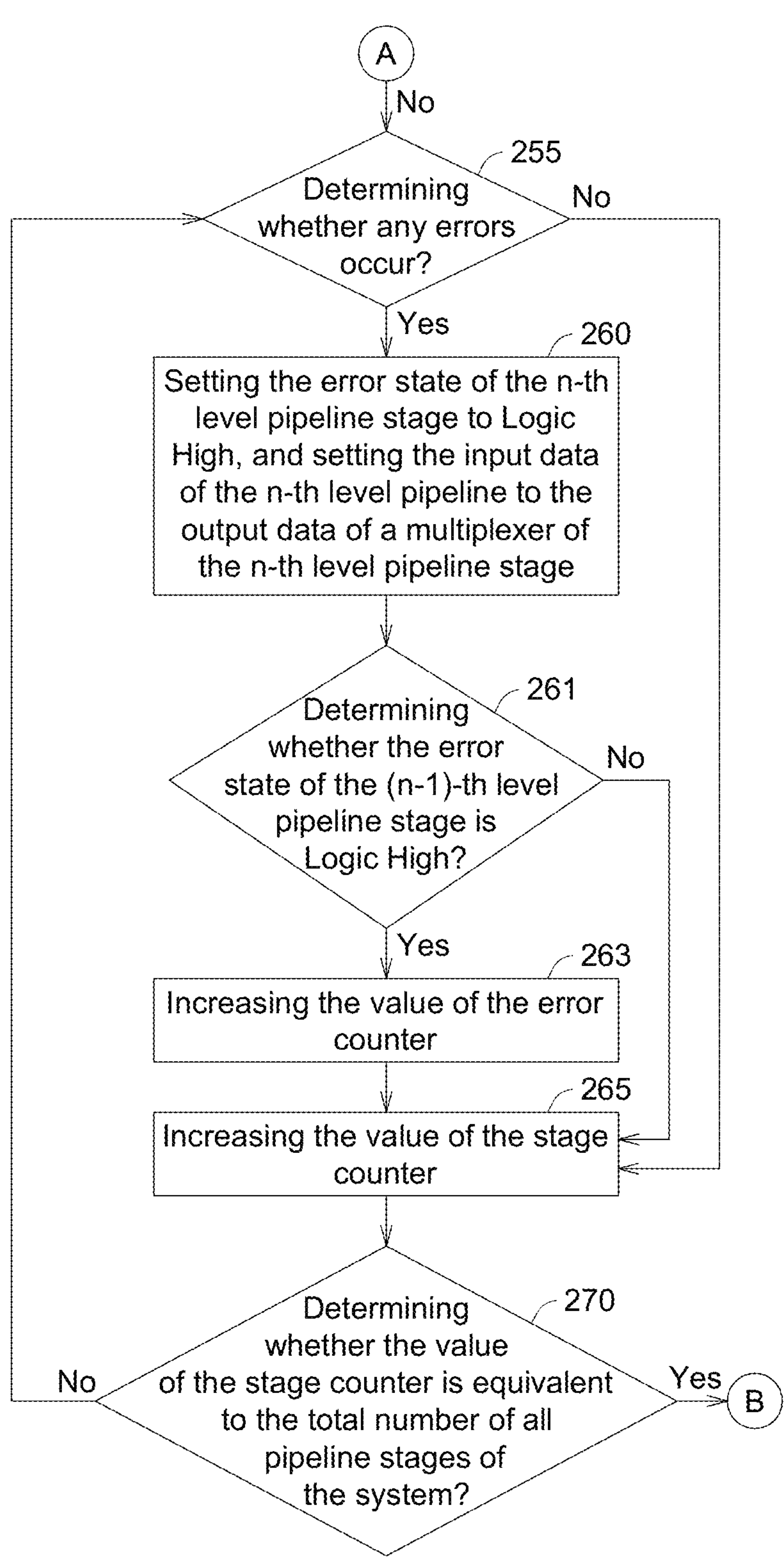

Referring to FIG. 2A and FIG. 2B, flowcharts of an error detection and correction method according to a second embodiment of the present invention are shown. FIG. 2A and FIG. 2B can be regarded as detailed flowcharts of FIG. 1.

In step 205, the error counter is reset to 0. The definition and generation of error state are disclosed below.

In step 210, all error states are reset to Logic Low, and the next rising or falling edge of the system clock is awaited.

In step 215, whether the next rising or falling edge of the system clock is detected is determined. If the determination result in step 215 is affirmative, the method continues to step 220; if the determination result in step 215 is negative, the method returns to step 210.

In step 220, whether the value of the error counter is greater than or equivalent to a critical value is determined (exemplarily but not restrictively, the critical value is 2). In an example of the present invention, when the value of the error counter is greater than or equivalent to 2, this indicates that at least 2 continuous pipeline stages have data error and need to be processed using system-level error correction.

If the determination result in step 220 is affirmative, the method continues to step 225; if the determination result in step 220 is negative, the method continues to step 235.

In step 225, the operations of all pipeline stage circuits are stopped.

In step 230, data of the pipeline stage circuits are flushed.

In step 233, data of the pipeline stage circuits are reprocessed (operated) at a downclocked frequency.

In step 235, the timer and the error counter are reset to 0.

In step 240, the timer is activated.

In step 245, the stage counter is reset to 0, wherein when the value of the stage counter is n, this indicates that whether the n-th level pipeline stage has an error is checked.

In step 250, whether the output value of the timer is equivalent to the value of the detection window Tw is determined, wherein, the detection window (Tw) is less than the cycle time (Tcp) of a clock signal. In a possible example, the first default value (Tw) is a half of the cycle time (Tcp) of the clock signal.

If the determination result in step 250 is affirmative, the method returns to step 210; and if the determination result in step 250 is negative, the method proceeds to step 255.

In step 255, whether any errors occur is determined. For example, whether the input data of the n-th level pipeline is equivalent to the sampling data of the n-th level pipeline stage is determined. That is, whether the operation of the n-th level pipeline stage has errors is determined. When the operation of the n-th level pipeline stage is completed, if the input data of the n-th level pipeline is equivalent to the sampling data of the n-th level pipeline, this indicates that the operation of the n-th level pipeline stage is free of error. Conversely, if the input data of the n-th level pipeline is not equivalent to the sampling data of the n-th level pipeline, this indicates that the operation of the n-th level pipeline stage has an error.

If the determination result in step 255 is affirmative, the method skips to step 260; and if the determination result in step 255 is negative, the method proceeds to step 265.

In step 260, the error state of the n-th level pipeline stage is set to Logic High, and the input data of the n-th level pipeline is set to the output data of a multiplexer of the n-th level pipeline stage. That is, the output data of the multiplexer of the n-th level pipeline stage is identical to the input data of the n-th level pipeline. This is circuit-level error detection and correction according to an embodiment of the present invention.

In step 261, whether the error state of the (n−1)-th level pipeline stage is Logic High is determined. If the determination result in step 261 is affirmative, the method continues to step 263; and if the determination result in step 261 is negative, the method continues to step 265.

In step 263, the value of the error counter is increased (exemplarily but not restrictively, the value is increased by 1).

In step 265, the value of the stage counter is increased (exemplarily but not restrictively, the value is increased by 1).

In step 270, whether the value of the stage counter is equivalent to the total number of all pipeline stages of the system is determined. If the determination result in step 270 is affirmative (this indicates that all pipeline stages have been processed), the method returns to step 240; and if the determination result in step 270 is negative, the method returns to step 255.

Figure 2C:
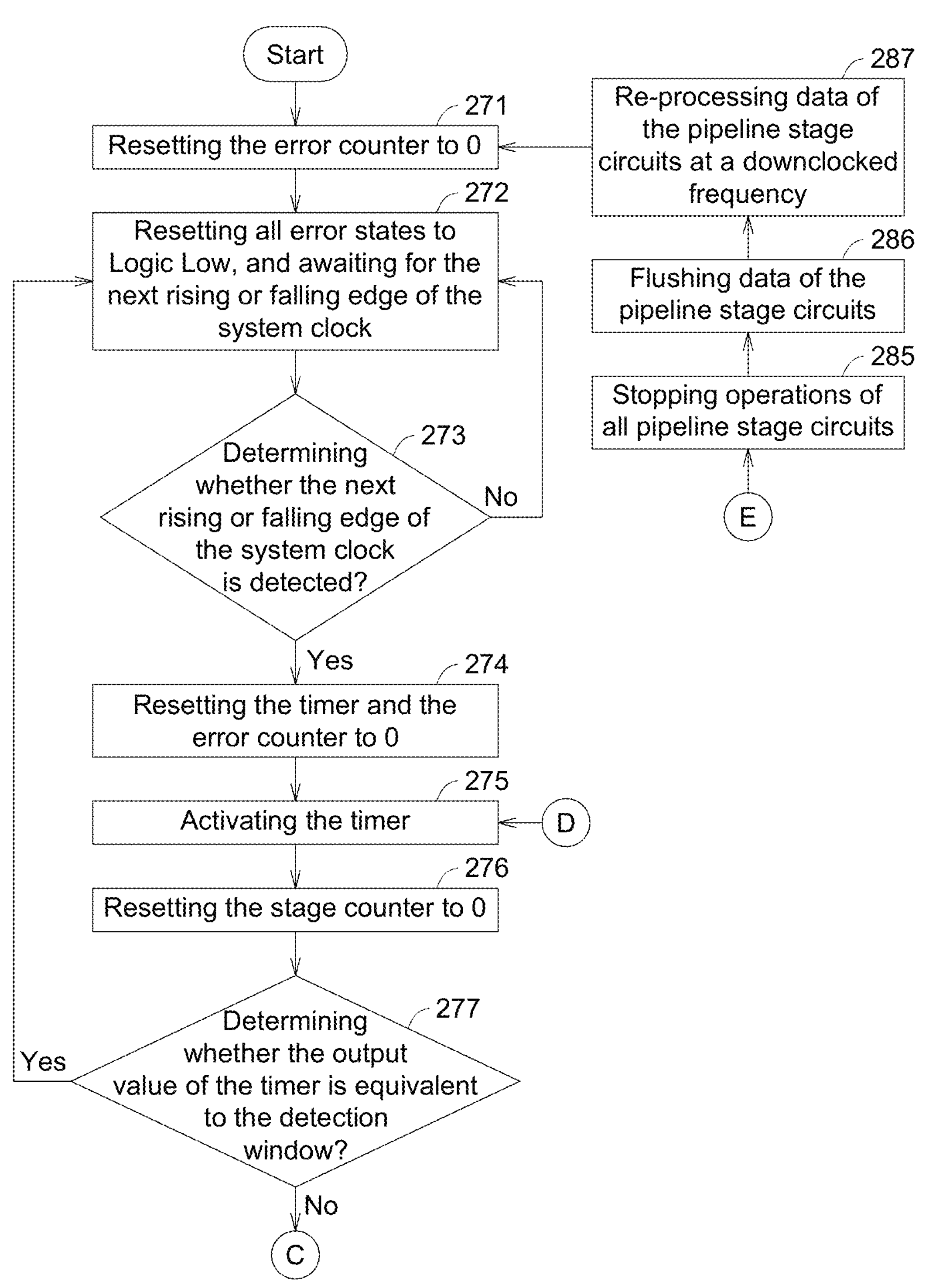
FIG. 2C and FIG. 2D are flowcharts of another error detection and correction method according to a second embodiment of the present invention.
Figure 2D:
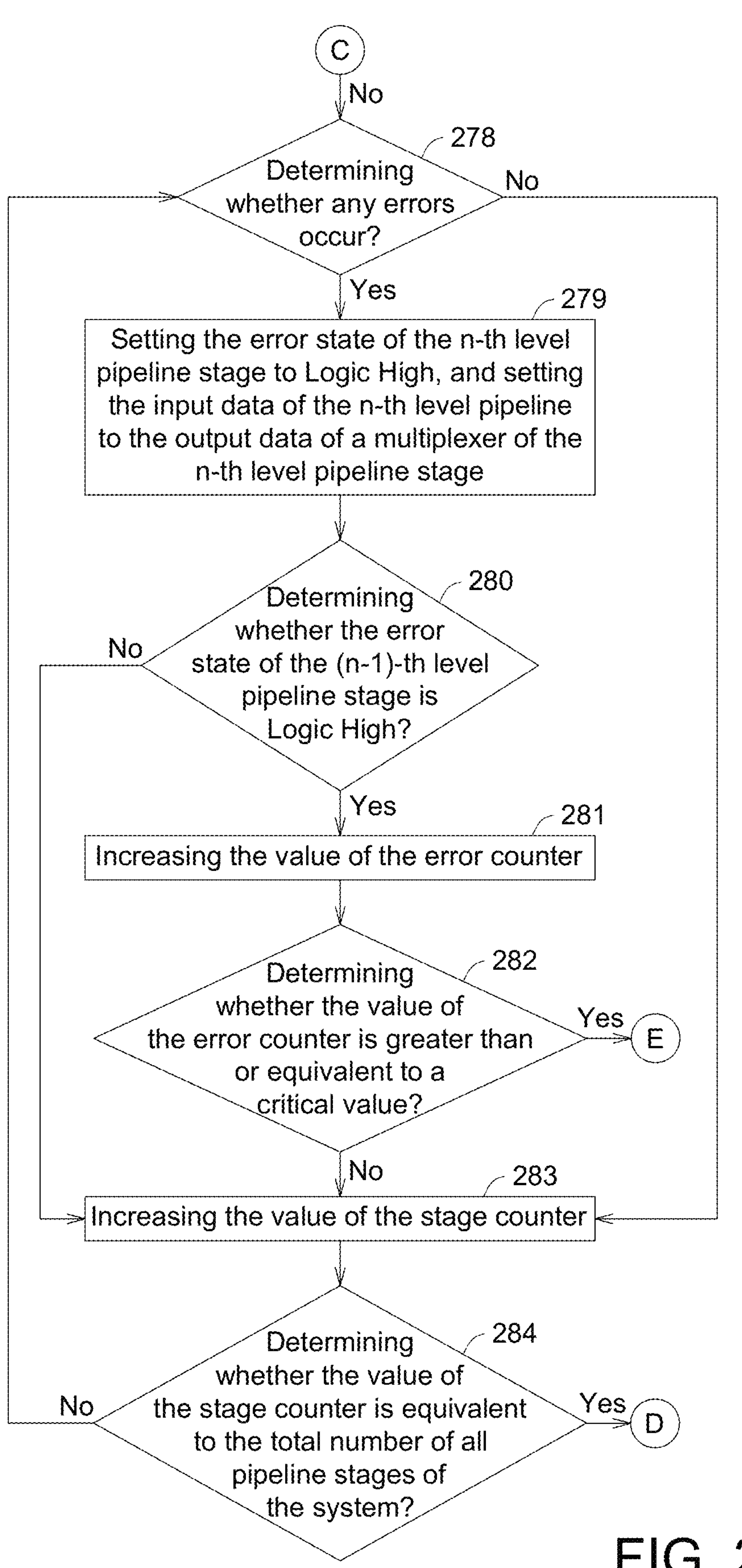

Referring to FIG. 2C and FIG. 2D, flowcharts of another error detection and correction method according to a second embodiment of the present invention are shown. FIG. 2C and FIG. 2D can be regarded as detailed flowcharts of FIG. 1.

In step 271, the error counter is reset to 0.

In step 272, all error states are reset to Logic Low, and the next rising or falling edge of the system clock is awaited.

In step 273, whether the next rising or falling edge of the system clock is detected is determined. If the determination result in step 273 is affirmative, the method continues to step 274. If the determination result in step 273 is negative, the method returns to step 272.

In step 274, the timer and the error counter are reset to 0.

In step 275, the timer is activated.

In step 276, the stage counter is reset to 0, wherein when the value of the stage counter is n, this indicates that whether the n-th level pipeline stage has an error is checked.

In step 277, whether the output value of the timer is equivalent to the detection window Tw is determined, wherein, the detection window (Tw) is less than the cycle time (Tcp) of a clock signal. In a possible example, the first default value (Tw) is a half of the cycle time (Tcp) of the clock signal.

If the determination result in step 277 is affirmative, the method returns to step 272; and if the determination result in step 277 is negative, the method proceeds to step 278.

In step 278, whether any errors occur is determined. For example, whether the input data of the n-th level pipeline is equivalent to the sampling data of the n-th level pipeline is determined. That is, whether the operation of the n-th level pipeline stage has an error is determined. When the operation of the n-th level pipeline stage is completed, if the input data of the n-th level pipeline is equivalent to the sampling data of the n-th level pipeline, this indicates that the operation of the n-th level pipeline stage is free of error. Conversely, if the input data of the n-th level pipeline is not equivalent to the sampling data of the n-th level pipeline, this indicates that the operations of the n-th level pipeline stage has an error.

If the determination result in step 278 is affirmative, the method skips to step 279; and if the determination result in step 278 is negative, the method proceeds to step 283.

In step 279, the error state of the n-th level pipeline stage is set to Logic High, and the input data of the n-th level pipeline is set to the output data of a multiplexer of the n-th level pipeline stage. That is, the n-th level pipeline stage the output data of the multiplexer is identical to the input data of the n-th level pipeline. This is circuit-level error detection and correction according to an embodiment of the present invention.

In step 280, whether the error state of the (n−1)-th level pipeline stage is Logic High is determined. If the determination result in step 280 is affirmative, the method continues to step 281; and if the determination result in step 280 is negative, the method continues to step 283.

In step 281, the value of the error counter is increased (exemplarily but not restrictively, the value is increased by 1).

In step 282, whether the value of the error counter is greater than or equivalent to a critical value is determined (exemplarily but not restrictively, the critical value is 2). In an example of the present invention, if the value of the error counter is greater than or equivalent to 2, this indicates that at least 2 continuous pipeline stages have data error and need to be processed using system-level error correction.

If the determination result in step 282 is affirmative, the method continues to step 285. If the determination result in step 282 is negative, the method continues to step 283.

In step 285, the operations of all pipeline stage circuits are stopped.

In step 286, data of the pipeline stage circuits are flushed.

In step 287, data of the pipeline stage circuits are reprocessed (operated) at a downclocked frequency.

In step 283, the value of the stage counter is increased (exemplarily but not restrictively, the value is increased by 1).

In step 284, whether the value of the stage counter is equivalent to the total number of all pipeline stages of the system is determined. If the determination result in step 284 is affirmative (this indicates that all pipeline stages have been processed), the method returns to step 275; and if the determination result in step 284 is negative, the method returns to step 278.

FIG. 3A to FIG. 3D are functional block diagrams of a circuit-level error detection and correction circuit according to several embodiments of the present invention. As indicated in FIG. 3A to FIG. 3D, the circuit-level error detection and correction circuits 300A~300D include: master latch circuits 310A~310D, slave latch circuit 320A~320D, error detection circuits 330A~330D, frequency division circuits 340A~340D and multiplexers 350A~350D. Besides, the circuit-level error detection and correction circuits 300A~300D further selectively include: detection enabling circuits 360A~360D coupled to the error detection circuits 330A~330D to enable or disable the error detection circuits 330A~330D.

Figure 3A:
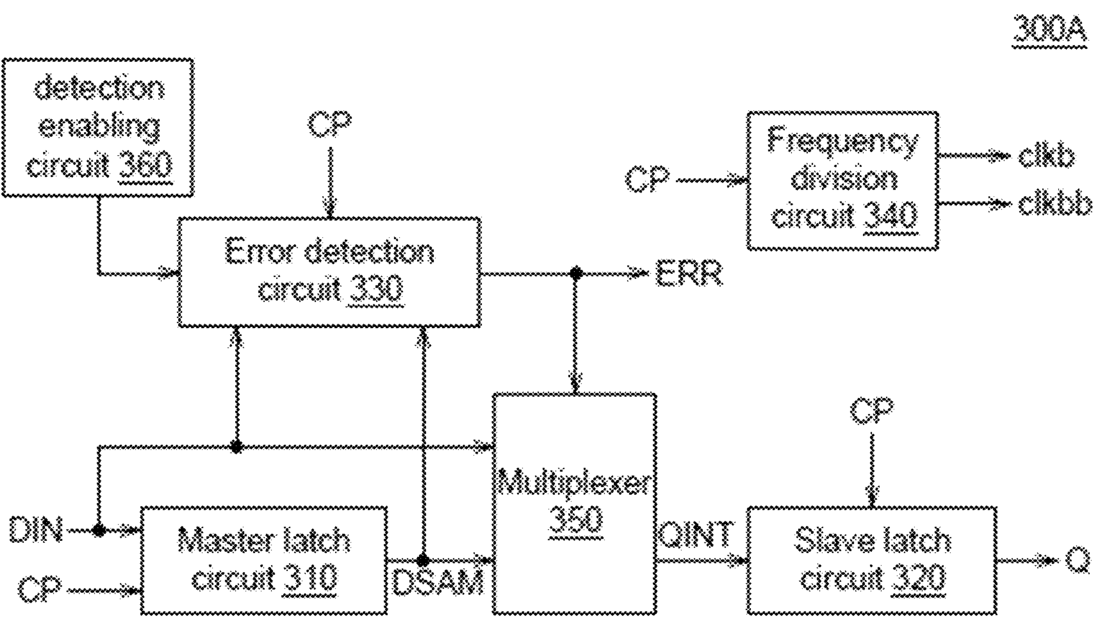
FIG. 3A to FIG. 3D are functional block diagrams of a circuit-level error detection and correction circuit according to several embodiments of the present invention.

Refer to FIG. 3A. The master latch circuit 310A is configured to generate a sampling data DSAM according to an input data DIN and a clock signal CP.

The error detection circuit 330A, coupled to the master latch circuit 310A, compares the input data DIN with the sampling data DSAM to generate a comparison result (that is, the error state ERR). For example, within an enabling period of the error detection circuit 330A, if the input data DIN is not equivalent to the sampling data DSAM, the error detection circuit 330A sets the error state ERR to Logic High (1) (that is, the pipeline stage of the current level has an error); when the input data DIN is equivalent to the sampling data DSAM, the error detection circuit 330A sets the error state ERR to Logic Low (0) (that is, the pipeline stage of the current level is free of error).

When the input data DIN is not equivalent to the sampling data DSAM (that is, the pipeline stage of the current level has an error), in response to the comparison result of the error detection circuit, the value of an error state counter coupled to the circuit-level error detection and correction circuit is increased.

The multiplexer 350A, coupled to the master latch circuit 310A and the error detection circuit 330A, outputs one of the input data DIN and the sampling data DSAM according to the comparison result (the error state ERR). The output data QINT of the multiplexer 350A is inputted to the slave latch circuit 320A. For example, when the error state ERR is Logic High (that is, the pipeline stage of the current level has an error), the output data QINT of the multiplexer 350A is equivalent to the input data DIN; when the error state ERR is Logic Low (that is, the pipeline stage of the current level is free of error), the output data QINT of the multiplexer 350A is equivalent to the sampling data DSAM.

The slave latch circuit 320A, coupled to the multiplexer 350A, receives the output data QINT of the multiplexer 350A to generate an output data Q.

The frequency division circuit 340A, coupled to the error detection circuit 330A, splits the clock signal CP into a first clock frequency division signal clkb and a second clock frequency division signal clkbb, which are then inputted to the master latch circuit 310A, the slave latch circuit 320A and the error detection circuit 330A.

As disclosed above, when an error is detected, the error can be corrected using the circuit-level error detection and correction circuit 300A of FIG. 3A.

Figure 3B:
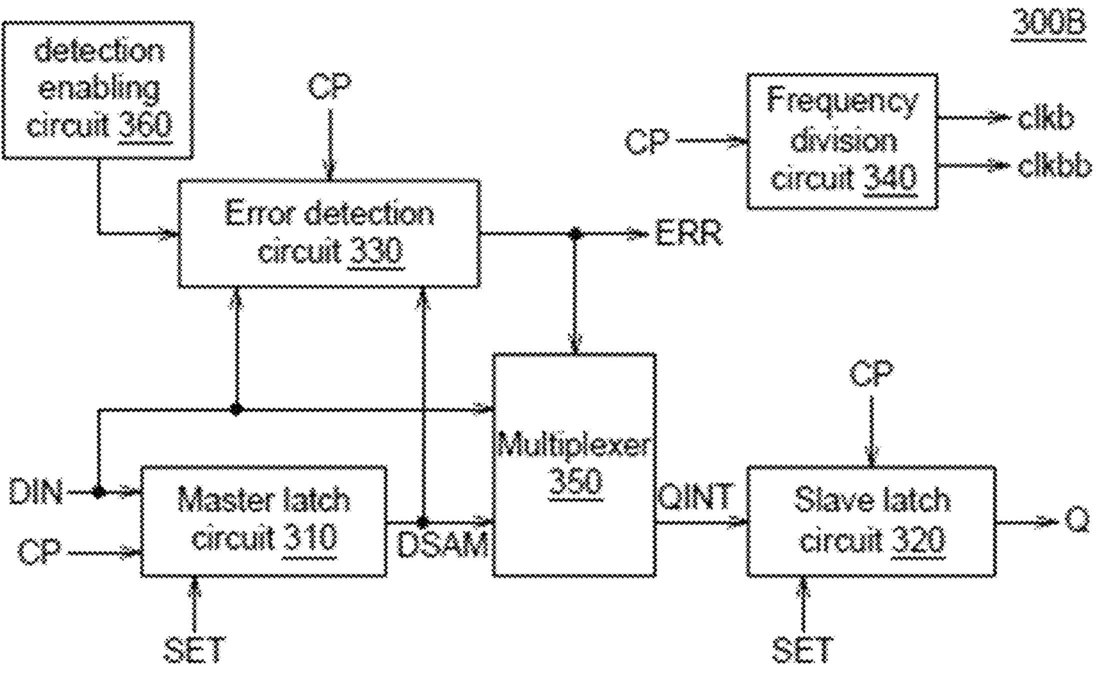

Refer to FIG. 3B. Basically, the operations of the master latch circuit 310B, the slave latch circuit 320B, the error detection circuit 330B, the frequency division circuit 340B and the multiplexer 350B are identical or similar to that of the master latch circuit 310A, the slave latch circuit 320A, the error detection circuit 330A, the frequency division circuit 340A and the multiplexer 350A of FIG. 3A, and the dissimilarities are disclosed below.

The master latch circuit 310B and the slave latch circuit 320B further receive a setting signal SET. The operation of the master latch circuit 310B is disclosed below. When the setting signal SET is at the second state (Logic High), the sampling data DSAM is at the second state (Logic High); when the setting signal SET and the clock signal CP both are at the first state (Logic Low), the sampling data DSAM is equivalent to the input data DIN; otherwise, the sampling data DSAM does not change.

The operation of the slave latch circuit 320B is disclosed below. When the setting signal SET is at the second state (Logic High), the output data Q is at the second state (Logic High); when the clock signal CP is at the second state (Logic High) and the setting signal SET is at the first state (Logic Low), the output data Q is equivalent to the output data QINT of the multiplexer 350A; otherwise, the output data Q does not change.

Figures 3C, 3D:
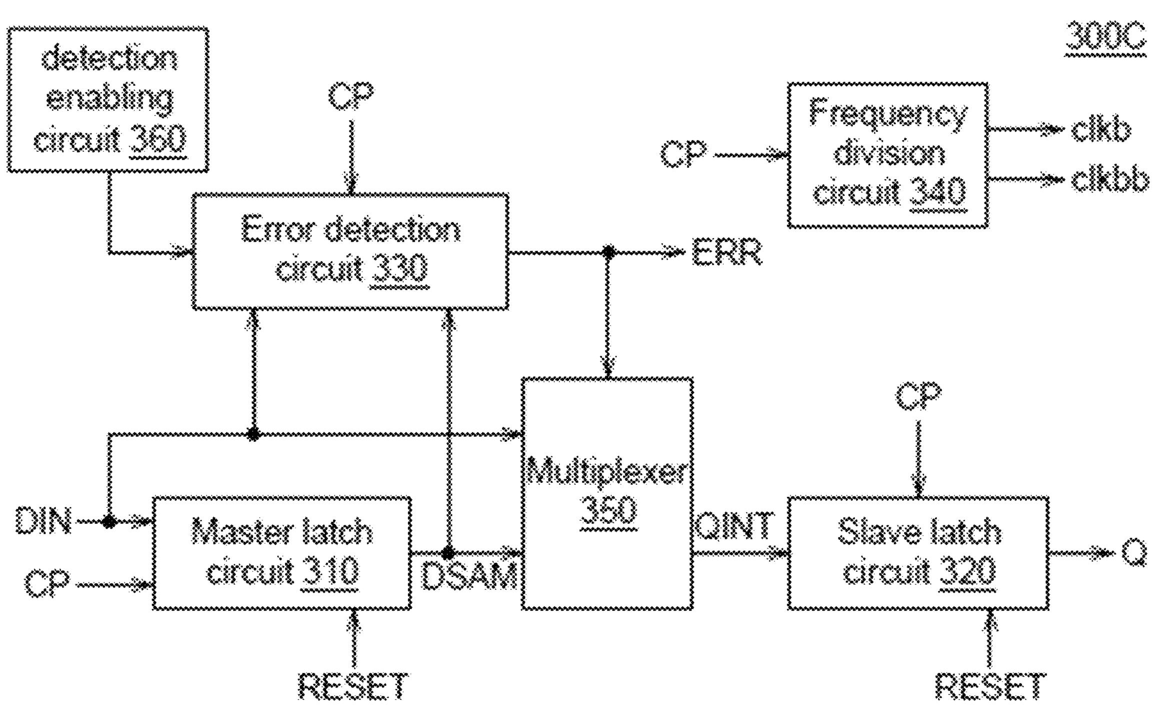

Refer to FIG. 3C. Basically, the operations of the master latch circuit 310C, the slave latch circuit 320C, the error detection circuit 330C, the frequency division circuit 340C and the multiplexer 350C are identical or similar to that of the master latch circuit 310A, the slave latch circuit 320A, the error detection circuit 330A, the frequency division circuit 340A and the multiplexer 350A of FIG. 3A, and their dissimilarities are disclosed below.

The master latch circuit 310C and the slave latch circuit 320C further receive a reset signal RESET. The operation of the master latch circuit 310C is disclosed below. When the reset signal RESET is at the second state (Logic High), the sampling data DSAM is at the first state (Logic Low); when the reset signal RESET and the clock signal CP both are at the first state (Logic Low), the sampling data DSAM is equivalent to the input data DIN; otherwise, the sampling data DSAM does not change.

The operation of the slave latch circuit 320C is disclosed below. When the reset signal RESET is at the second state (Logic High), the output data Q is the first state (Logic Low); when the clock signal CP is at the second state (Logic High) and the reset signal RESET is at the first state (Logic Low), the output data Q is equivalent to the output data QINT; otherwise, the output data Q does not change.

Refer to FIG. 3D. Basically, the operations of the master latch circuit 310D, the slave latch circuit 320D, the error detection circuit 330D, the frequency division circuit 340D and the multiplexer 350D are identical or similar to that of the master latch circuit 310A, the slave latch circuit 320A, the error detection circuit 330A, the frequency division circuit 340A and the multiplexer 350A of FIG. 3A, and their dissimilarities are disclosed below.

The master latch circuit 310D and the slave latch circuit 320D further receive a setting signal SET and a reset signal RESET.

The operations of the master latch circuit 310D is disclosed below. When the reset signal RESET is at the second state (Logic High), the sampling data DSAM is at the first state (Logic Low); when the setting signal SET is at the second state (Logic High) and the reset signal RESET is at the first state (Logic Low), the sampling data DSAM is at the second state (Logic High); when the setting signal SET, the reset signal RESET and the clock signal CP are at the first state (Logic Low), the sampling data DSAM is equivalent to the input data DIN; otherwise, the sampling data DSAM does not change.

The operation of the slave latch circuit 320D is disclosed below. When the reset signal RESET is at the second state (Logic High), the output data Q is at the first state (Logic Low); when the setting signal SET is at the second state (Logic High) and the reset signal RESET is at the first state (Logic Low), the output data Q is at the second state (Logic High); when the clock signal CP is at the second state (Logic High) and the setting signal SET and the reset signal RESET both are at the first state (Logic Low), the output data Q is equivalent to the output data QINT; otherwise, the output data Q does not change.

Figure 4:
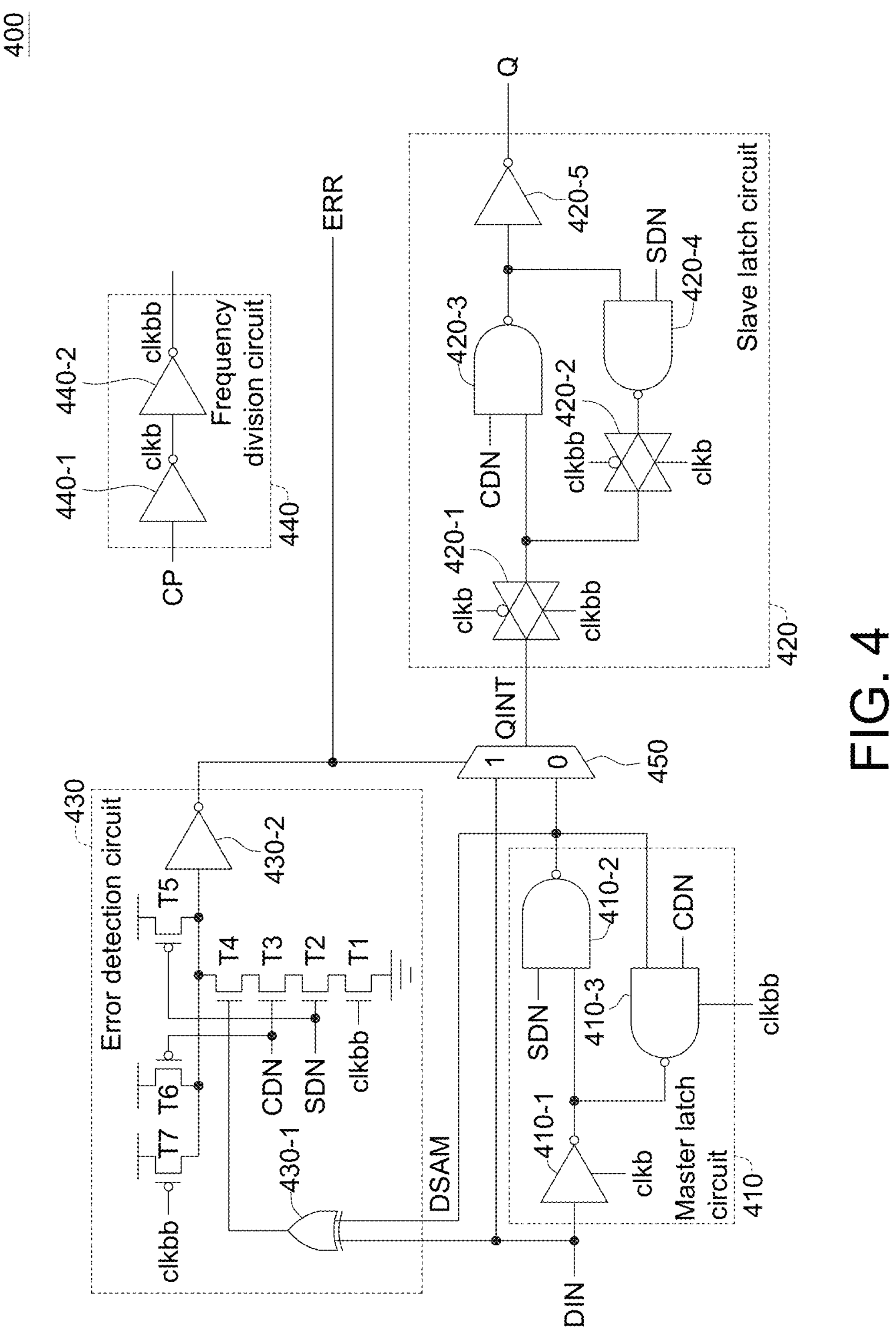
FIG. 4 is a detailed circuit diagram of a circuit-level error detection and correction circuit according to an embodiment of the present invention.

FIG. 4 is a detailed circuit diagram of a circuit-level error detection and correction circuit according to an embodiment of the present invention. The circuit-level error detection and correction circuit 400 of FIG. 4 can implement the circuit-level error detection and correction circuits 300A~300D of FIG. 3A to FIG. 3D. The circuit-level error detection and correction circuit 400 can be realized by a D-type flip-flop, but the present invention is not limited thereto.

The circuit-level error detection and correction circuit 400 includes a master latch circuit 410, a slave latch circuit 420, an error detection circuit 430, a frequency division circuit 440 and a multiplexer 450. The master latch circuit 410, the slave latch circuit 420, the error detection circuit 430, the frequency division circuit 440 and the multiplexer 450 respectively can implement the master latch circuits 310A~310D, the slave latch circuit 320A~320D, the error detection circuits 330A~330D, the frequency division circuits 340A~340D and multiplexers 350A~350D.

The master latch circuit 410 includes logic circuits 410-1~410-3, wherein, the logic circuit 410-1 can be realized by is not limited to inverters; the logic circuits 410-2 and 410-3 can be realized by is not limited to NAND gates.

The logic circuit 410-1 is controlled by the first clock frequency division signal clkb. The input end of the logic circuit 410-1 receives the input data DIN; and the output end of the logic circuit 410-1 is coupled to the output end of the logic circuit 410-2.

The two input ends of the logic circuit 410-2 respectively receive the input signal SDN and the output end of the logic circuit 410-1, wherein, the input signal SDN has asynchronous setting with negative-level sensitivity. The output end of the logic circuit 410-2 is coupled to the logic circuit 410-3, the frequency division circuit 440 and the multiplexer 450. The logic circuit 410-2 outputs the sampling data DSAM.

The two input ends of the logic circuit 410-3 respectively receive the input signal CDN and the output end of the logic circuit 410-2 (the sampling data DSAM), wherein, the input signal CDN has asynchronous negative resetting with negative-level sensitivity. The logic circuit 410-3 is controlled by the second clock frequency division signal clkbb. The output end of the logic circuit 410-3 is coupled to one input end of the logic circuit 410-2.

The slave latch circuit 420 includes logic circuits 420-1~420-5, wherein, the logic circuits 420-1 and 420-2 can be realized by is not limited to transmission gates; the logic circuit 420-3 and 420-4 can be realized by is not limited to NAND gates; and the logic circuit 420-5 can be realized by is not limited to an inverter.

The logic circuit 420-1 is controlled by the first clock frequency division signal clkb and the second clock frequency division signal clkbb. The input end of the logic circuit 420-1 receives the output of the multiplexer 450. The output end of the logic circuit 420-1 is coupled to the input end of the logic circuit 420-3.

The logic circuit 420-2 is controlled by the first clock frequency division signal clkb and the second clock frequency division signal clkbb. The input end of the logic circuit 420-2 receives the output of the logic circuit 420-4. The output end of the logic circuit 420-2 is coupled to the input end of the logic circuit 420-3.

The two input ends of the logic circuit 420-3 respectively receive the input signal CDN, the output end of the logic circuit 420-1 and the output end of the logic circuit 420-2. The output end of the logic circuit 420-3 is coupled to the input end of the logic circuit 420-4 and the logic circuit 420-5.

The two input ends of the logic circuit 420-4 respectively receive the input signal SDN and the output end of the logic circuit 420-3. The output end of the logic circuit 420-4 is coupled to the input end of the logic circuit 420-2.

The input end of the logic circuit 420-5 receives the output end of the logic circuit 420-3. The output end of the logic circuit 420-4 outputs the output data Q.

The error detection circuit 430 includes logic circuit 430-1 and 430-2, and transistors T1~T7. The logic circuit 430-1 can be realized by is not limited to an EXOR logic gate, the logic circuit 430-2 can be realized by is not limited to an inverter.

The two input ends of the logic circuit 430-1 respectively receive the input data DIN and the sampling data DSAM. The output end of the logic circuit 430-1 is inputted to the gate of the transistor T4.

The transistors T1~T4 are cascaded coupled between the input end of the logic gate 430-2 and the ground end. The gates of the transistors T1~T4 respectively receive the second clock frequency division signal clkbb, the input signal SDN, the input signal CDN and the output end of the logic circuit 430-1.

The three ends of the transistor T5 respectively are coupled to the operating voltage, the input signal SDN and the input end of the logic circuit 430-2. The three ends of the transistor T6 respectively are coupled to the operating voltage, the input signal CDN and the input end of the logic circuit 430-2. The three ends of the transistor T7 respectively are coupled to the operating voltage, the second clock frequency division signal clkbb and the input end of the logic circuit 430-2.

The input end of the logic circuit 430-2 is coupled to the transistors T4~T7. The output end of the logic circuit 430-2 outputs the error state ERR.

The frequency division circuit 440 includes logic circuits 440-1 and 440-2. The logic circuits 440-1 and 440-2 can be realized by, but not limited to, inverters. The logic circuit 440-1 receives the clock signal CP to generate the first clock frequency division signal clkb; and the logic circuit 440-2 receives the first clock frequency division signal clkb to generate the second clock frequency division signal clkbb.

The multiplexer 450 is controlled by the error state ERR. The multiplexer 450 receives the input data DIN and the sampling data DSAM, and outputs an output data QINT. When the error state ERR is Logic Low, the output data QINT is equivalent to the input data DIN; and, when the error state ERR is Logic Low, the output data QINT is equivalent to the sampling data DSAM.

In an embodiment of the present invention, the implementation cost of digital circuit can be effectively reduced by using the circuit-level error detection and correction circuit with asynchronous setting and resetting functions.

Figure 5:
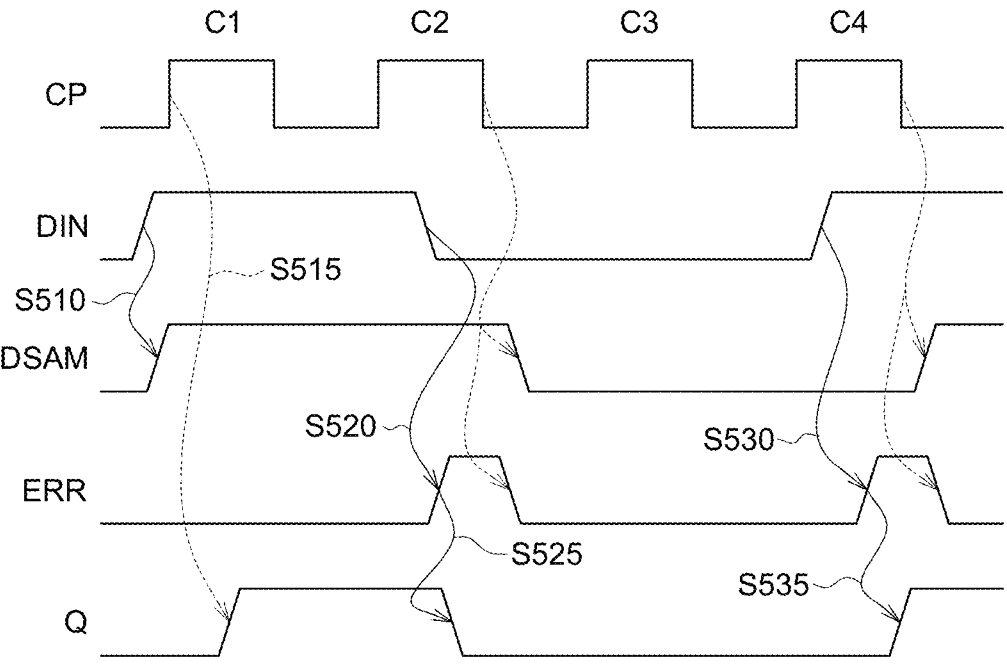
FIG. 5 is a signal waveform of a circuit-level error detection and correction circuit according to an embodiment of the present invention.

FIG. 5 is a signal waveform of a circuit-level error detection and correction circuit according to an embodiment of the present invention. Prior to the rising edge of the first cycle C1 of the clock signal CP, both the input data DIN and the sampling data DSAM already transitioned to Logic High (as indicated by the timing S510). Within the Logic High period of the first cycle C1 of the clock signal CP, the input data DIN is equivalent to the sampling data DSAM, that is, free of error (the error state ERR remains at Logic Low). Since the input data DIN is equivalent to the sampling data DSAM, that is, free of error, the sampling data DSAM is used as the input of the slave latch circuit, then the output data Q is outputted (that is, the sampling data DSAM is sampled as the output data Q) as indicated by the timing S515.

Within the Logic High period of the second cycle C2 of the clock signal CP, the input data DIN transitions to Logic Low (but the sampling data DSAM still remains at Logic High), therefore error occurs (the input data DIN is not equivalent to the sampling data DSAM), and the error state ERR transitions to Logic High (as indicated by the timing S520). When the error state ERR transitions to Logic High, the input data DIN is not equivalent to the sampling data DSAM, and thus error occurs. Hence, the input data DIN is used as the input of the slave latch circuit and the output data Q is outputted (that is, the input data DIN is sampled as the output data Q) as indicated by the timing S525.

Similarly, within the Logic High period of the third cycle C3 of the clock signal CP, the input data DIN is equivalent to the sampling data DSAM, that is, free of error (the error state ERR remains at Logic Low), therefore the sampling data DSAM is used as the input of the slave latch circuit, then the output data Q is outputted (that is, the sampling data DSAM is sampled as the output data Q).

Within the Logic High period of the fourth cycle C4 of the clock signal CP, the input data DIN transitions to Logic High (but the sampling data DSAM still remains at Logic Low), therefore error occurs (the input data DIN is not equivalent to the sampling data DSAM), the error state ERR transitions to Logic High (as indicated by the timing S530). Since error occurs, the input data DIN is used as the input of the slave latch circuit 320A, and the output data Q is outputted (that is, the input data DIN is sampled as the output data Q) as indicated by the timing S535.

As indicated in the timing diagram of FIG. 5, after detecting an error, the circuit-level error detection and correction circuit according to an embodiment of the present invention corrects the error by using the input data DIN as the input of the slave latch circuit and then outputting the output data Q. On the other hand, when no errors are detected (the input data DIN is equivalent to the sampling data DSAM), the sampling data DSAM is used as the input the slave latch circuit and the output data Q is outputted (that is, the sampling data DSAM is sampled as the output data Q).

FIG. 6 is a flowchart of an error detection and correction method of a pipeline stage circuit according to an embodiment of the present invention. In step 605, a first input signal is received.

In step 610, a clock signal is detected, and whether a rising edge or a falling edge of the clock signal is detected is determined. If the determination result in step 610 is affirmative, the method proceeds to step 615. If the determination result in step 610 is negative, the method repeats step 610.

In step 615, a timer is reset to 0, and an error count is reset to 0.

In step 620, the timer is activated.

In step 625, the first input signal is inputted to a first signal processing unit (such as the master latch circuit) to generate a first output signal.

In step 630, whether the timer output value is equivalent to a first default value is determined. If the determination result in step 630 is affirmative, the method returns to step 610. If the determination result in step 630 is negative, the method proceeds to step 635. In step 630, the first default value is the detection window (Tw), wherein the first default value is less than is equivalent to the cycle time (Tcp) of a clock signal. In a possible example, the first default value (Tw) is a half of the cycle time (Tcp) of the clock signal.

In step 635, a comparison between the first input signal and the first output signal is made to determine whether any errors occur. If any errors occur, the method continues to step 640; and if no errors occur, the method returns to step 625.

In step 640, an error state signal (ERR) is set to a first level.

In step 645, the first input signal or the first output signal is transmitted to a second signal processing unit (such as the slave latch circuit).

The step 605 further includes: resetting the error state signal (such as the signal ERR of FIG. 4) to a second level, wherein the first level and the second level are high and low levels in a relative sense. The first level can be a high level or a low level as long as the first level and the second level are opposite (high and low levels in a relative sense).

The step 625 further includes: operating the first signal processing unit at a first clock frequency to sample the first input signal to generate the first output signal.

In a possible embodiment of the present invention, after step 645, the method further includes step 650. In step 650, whether the value of an error counter is greater than a second default value is determined (exemplarily but not restrictively, the second default value is 2, which indicates that 2 continuous errors are detected, then system-level error correction is activated to correct the continuous (such as 2) pipeline stage errors). If the determination result in step 650 is affirmative, the method proceeds to step 655; and if the determination result in step 650 is negative, the method proceeds to step 615.

In step 655, all processing operations of the pipeline stages are stopped, and all data signals of the pipeline stages are flushed.

In step 660, the first signal processing unit is operated at a second clock frequency, wherein the second clock frequency is lower than the first clock frequency. After step 660, the method returns to step 605.

In step 615, the method further includes: resetting the error counter to 0.

In step 620, the method further includes: resetting a stage counter to 0.

In step 640, the method further includes: accumulating the value of the error counter.

In step 645, the method further includes: accumulating the value of the stage counter.

After step 645, the method further includes step 665. In step 665, whether the stage counter output value is equivalent to a third default value is determined (the third default value represents the total number of pipeline stage circuits). If the determination result is affirmative, the method returns to step 620; and if the determination result is negative, the method returns to step 635.

In an embodiment of the present invention, the sequential control system operated according to system clock is provided with error detection and error correction functions.

Figure 7:
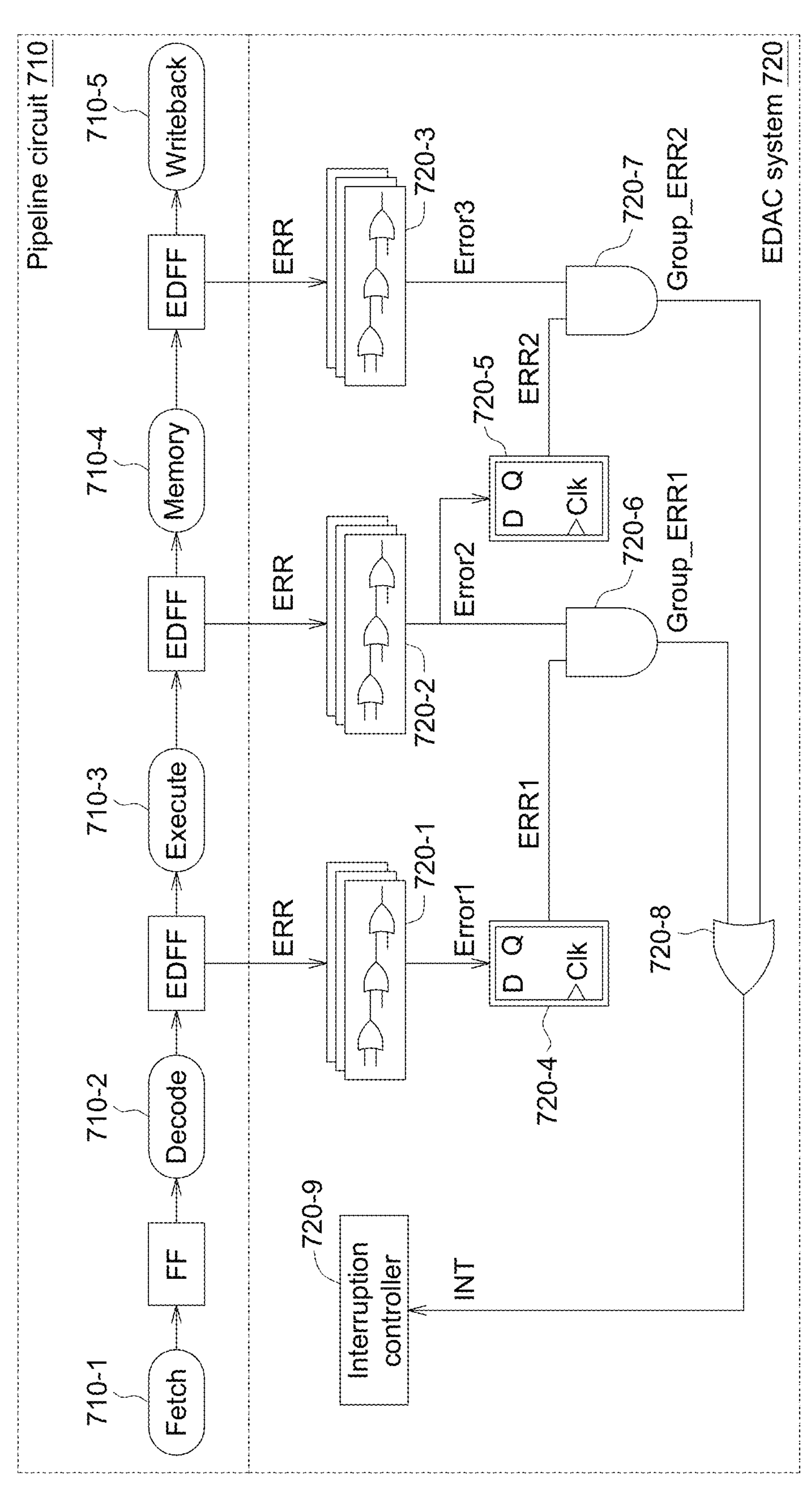
FIG. 7 is a functional block diagram of an electronic device according to an embodiment of the present invention.

FIG. 7 is a functional block diagram of an electronic device 700 according to an embodiment of the present invention. The error detection and correction system 700 according to an embodiment of the present invention includes: a pipeline circuit 710 and a system error detection and correction circuit 720. The pipeline circuit 710 includes cascaded multiple pipeline stage circuits 710-1~710-5, at least one standard flip-flop FF, and a plurality of EDFFs, wherein, the EDFFs represent the circuit-level error detection and correction circuits disclosed above (FIG. 3A to FIG. 3D, and FIG. 4). Here, the operations of the pipeline stage circuits 710-1~710-5 include but are not limited to fetch, decode, execute, memory, and writeback. In the specification of the present invention, the standard flip-flop FF and the EDFFs are also a part of the pipeline circuits.

As indicated in FIG. 7, the pipeline circuit 710 at least includes: a first pipeline stage circuit, a first circuit-level error detection and correction circuit coupled to the first pipeline stage circuit, a second pipeline stage circuit coupled to the first circuit-level error detection and correction circuit, and a second circuit-level error detection and correction circuit coupled to the second pipeline stage circuit, wherein, the architecture and operations of the first circuit-level error detection and correction circuit are basically the same as that of the second circuit-level error detection and correction circuit.

The system error detection and correction circuit 720 is coupled to the pipeline circuit 710. When the system error detection and correction circuit 720 detects that the pipeline stage circuits 710-1~710-5 of the pipeline circuit 710 have continuous pipeline stage errors, the system error detection and correction circuit 720 stops the operations of all pipeline stage circuits 710-1~710-5, flushes the data of the pipeline stage circuits 710-1~710-5, and re-processes the data of the pipeline stage circuits 710-1~710-5 at a downclocked frequency.

The system error detection and correction circuit 720 includes: a plurality of logic circuits 720-1~720-8 and an interruption controller 720-9. The logic circuits 720-1~720-3 can be realized by a logic OR-tree but are not limited thereto. The logic circuits 720-4~720-5 can be realized by registers but are not limited thereto. The logic circuits 720-6~720-7 can be realized by AND logic gates but are not limited thereto. The logic circuit 720-8 can be realized by an Or logic gate but is not limited thereto.

The EDFFs respectively output an error state ERR to the logic circuits 720-1~720-3. The logic circuits 720-1~720-3 respectively output signals Error1~Error3. The logic circuits 720-4 and 720-5 respectively receive signals Error1 and Error2, and output signals ERR1 and ERR2. The logic circuit 720-6 receives signals ERR1 and Error2 to generate a signal Group_ERR1. The logic circuit 720-7 receives signals ERR2 and Error3 to generate a signal Group_ERR2. The logic circuit 720-8 receives the signals Group_ERR1 and Group_ERR2 to generate an interruption signal INT. In response to the interruption signal INT (that is, when the system error detection and correction circuit 720 detects that the pipeline stage circuits 710-1~710-5 of the pipeline circuit 710 have continuous pipeline stage errors), the system error detection and correction circuit 720 stops the operations of all pipeline stage circuits 710-1~710-5; flushes the data of the pipeline stage circuits 710-1~710-5, and re-processes the data of the pipeline stage circuits 710-1~710-5 at a downclocked frequency.

In response to interruption signal, the interruption controller 720-9 enables multi-level pipelines 710-1~710-5 of the pipeline circuit 710 to stop the operations of the pipelines, flush the data of the pipelines, and re-process data at a downclocked frequency.

The system error detection and correction circuit 720 includes: a plurality of error state reception units (such as logic gates 720-1~720-3), a plurality of continuous error state detection units (includes logic gate 720-4 and 720-6, or, includes logic gate 720-5 and 720-7), a global system error detection unit (such as logic gate 720-8), and an interruption controller 720-9. Each of the error state reception units receives an error state signal from the error detection unit. The continuous error state detection units (including logic gate 720-4 and 720-6, or, includes logic gate 720-5 and 720-7) are coupled to adjacent error state reception units with continuous stages. The global system error detection unit (such as logic gate 720-8) is coupled to the continuous error state detection units. The interruption controller 720-9 is coupled to the global system error detection unit to interrupt and re-activate the pipeline circuit. When the continuous error state detection units detect continuous error states, the continuous error state detection units notify the global system error detection unit, which then stops the operations of all pipeline stage circuits through the interruption controller, flushes the data of the pipeline stage circuits, and re-activates the pipeline circuit at a downclocked frequency.

In an embodiment of the present invention, when two adjacent pipelines (such as pipeline 710-2 and 710-3) have errors, the interruption signal INT is triggered.

Figure 8:
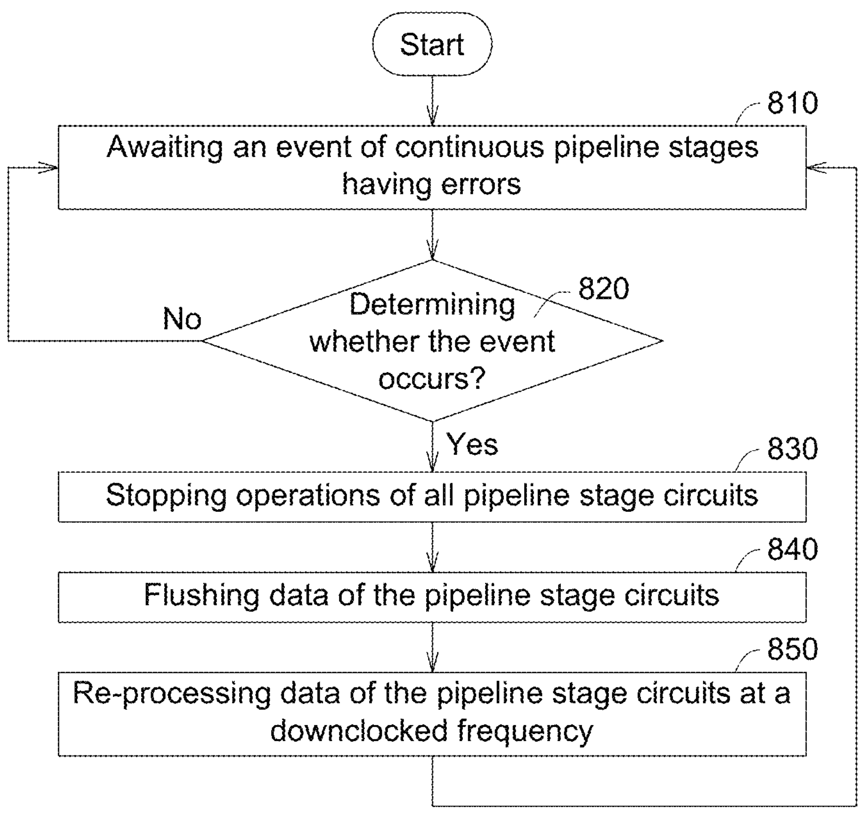
FIG. 8 is a system flowchart of an error detection and correction method according to an embodiment of the present invention.

FIG. 8 is a system flowchart of an error detection and correction method according to an embodiment of the present invention. As indicated in FIG. 8, in step 810, an event of continuous pipeline stages having errors are awaited. In step 820, whether the event occurs is determined. If the determination result in step 820 is affirmative, the method proceeds to step 830; and if the determination result in step 820 is negative, the method returns to step 810.

In step 830, the operations of all pipeline stage circuits are stopped.

In step 840, data of the pipeline stage circuits are flushed.

In step 850, data of the pipeline stage circuits are re-processed (operated) at a downclocked frequency. In an embodiment of the present invention, the frequency can be downclocked to such as 90% of the original frequency or lower.

Figure 9:
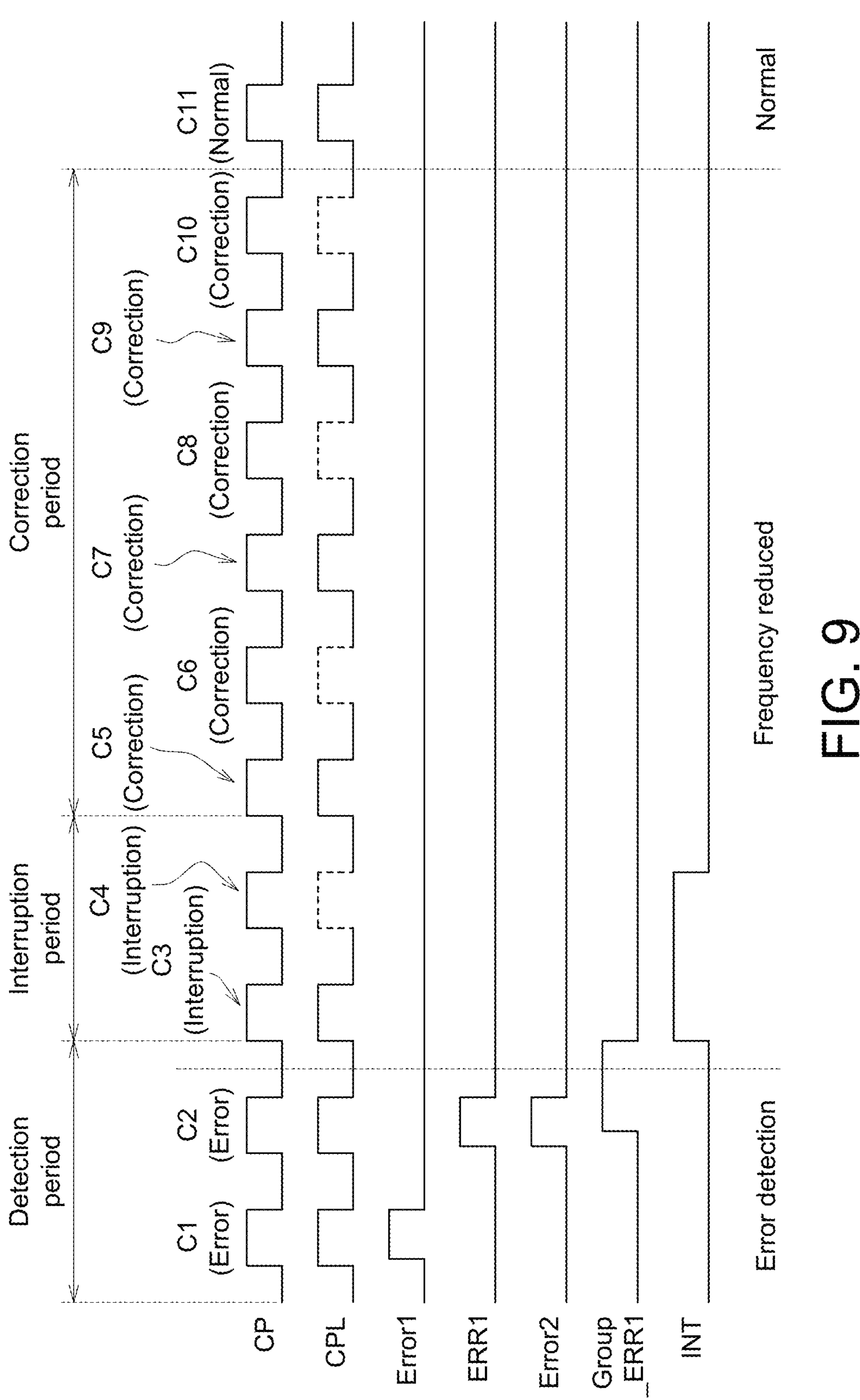
FIG. 9 is a signal waveform of a system error detection and correction circuit according to an embodiment of the present invention.

FIG. 9 is a signal waveform of a system error detection and correction circuit according to an embodiment of the present invention. Since an error occurs within the first cycle C1 of the clock signal CP, an error signal Error1 is generated. Since another error occurs within the second cycle C2 of the clock signal CP, an error signal Error2 is generated. As indicated in FIG. 7, since two continuous pipeline stages have errors, a signal Group_ERR1 is generated. Then, within the third cycle C3 and the fourth cycle C4 of the clock signal CP, an interruption signal INT is generated. When the interruption signal is generated, the pipeline stage is operated at a downclocked frequency, wherein, the clock signal CPL of FIG. 9 represents a downclocking version of the clock signal CP. Here, the clock signal CPL represents a 50% downclocking version of the clock signal CP, but the present invention is not limited thereto. In practice, the frequency of the clock signal CPL only needs to be equivalent to or lower than 90% of the clock signal CP.

Within the 5-th cycle C5 to the 10-th cycle C10 of the clock signal CP, system-level correction is performed. That is, when the pipeline stage is operated at a downclocked frequency, the probability of the pipeline stage having an error will be greatly reduced, and such operation can be regarded as system-level correction.

Within the 11-th cycle C11 of the clock signal CP, the pipeline stage resumes normal operation.

In an embodiment of the present invention, the sequential control system can be provided with error detection and correction function through system-level error detection and correction.

When the power source voltage is close to or lower than the critical voltage of MOSFET, the logic circuit of static CMOS will have a larger stability variation.

Thus, in an embodiment of the present invention, the circuit-level error detection and correction circuit and the system error detection and correction circuit use a high threshold voltage device. The advantage of using a high threshold voltage device is that the problem of having a larger stability variation can be relieved. In comparison to an ordinary threshold voltage device or a low threshold voltage device, a high threshold voltage device increases the lower limit of static noise margin (SNM) of a CMOS circuit.

To summarize, in an embodiment of the present invention, single pipeline stage error can be detected and corrected using circuit-level error detection and correction. As for continuous pipeline stage errors, they can be detected and corrected using system-level error detection and correction.

In an embodiment of the present invention, when any pipeline stage has an error, the error can be real-time corrected using a circuit-level error detection and correction circuit and mechanism. Thus, the present invention can achieve real-time error correction (that is, error is detected and corrected within a clock cycle.

However, if there are too many pipeline stage errors and correction cannot be completed within a clock cycle, the problem can be resolved using a system error detection and correction circuit and mechanism.

Thus, the present invention has the following advantages: (1) the present invention has higher reliability and lower power consumption; (2) in comparison to the conventional method, the present invention incurs lower implementation cost (such as instruction cost) because the system error detection and correction circuit and mechanism are used only when there are too many errors in pipeline stage and correction cannot be completed within a clock cycle; (3) since existing standard digital design process can be directly used in two-level EDAC system, the present invention has larger scalability and lower implementation cost.

While the invention has been described by way of example and in terms of the preferred embodiment(s), it is to be understood that the invention is not limited thereto. Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. An error detection and correction circuit, comprising:
- a master latch circuit configured to receive an input data and generate a sampling data;
- an error detection circuit coupled to the master latch circuit to compare the input data with the sampling data to generate a comparison result;
- a multiplexer coupled to the master latch circuit and the error detection circuit; and
- a slave latch circuit coupled to the multiplexer to receive a multiplexer output from the multiplexer and generate an output data,
- wherein, the multiplexer determines whether to output the input data or the sampling data to the slave latch circuit according to the comparison result.

2. The error detection and correction circuit according to claim 1, wherein, when the input data is identical to the sampling data, the multiplexer outputs the sampling data to the slave latch circuit; and, when the input data is different from the sampling data, the multiplexer outputs the input data to the slave latch circuit.

3. The error detection and correction circuit according to claim 1, wherein the error detection and correction circuit uses a high threshold voltage device.

4. The error detection and correction circuit according to claim 1, further comprising:
- a detection enabling circuit coupled to the error detection circuit to enable or disable the error detection circuit; and
- a frequency division circuit coupled to the error detection circuit to generate a plurality of clock frequency division signals according to a clock signal and output the clock frequency division signals to the error detection circuit, the master latch circuit and the slave latch circuit.

5. The error detection and correction circuit according to claim 1, wherein,
- the master latch circuit and the slave latch circuit further receive a setting signal, the master latch circuit generates the sampling data according to the setting signal, and the slave latch circuit generates the output data; or,
- the master latch circuit and the slave latch circuit further receive a reset signal, the master latch circuit generates the sampling data according to the setting signal, and the slave latch circuit generates the output data; or
- the master latch circuit and the slave latch circuit further receive the setting signal and the reset signal, the master latch circuit generates the sampling data according to the setting signal and the reset signal, and the slave latch circuit generates the output data.

6. The error detection and correction circuit according to claim 1, further comprising an error state counter coupled to the error detection circuit, wherein, when the input data is different from the sampling data, in response to the comparison result of the error detection circuit, the value of the error state counter is increased.

7. An error detection and correction system, comprising:
- a pipeline circuit, operated at a first operating frequency, the pipeline circuit comprising: a first pipeline stage circuit, a first error detection and correction circuit coupled to the first pipeline stage circuit, a second pipeline stage circuit coupled to the first error detection and correction circuit, and a second error detection and correction circuit coupled to the second pipeline stage circuit, wherein each of the first and second error detection and correction circuits comprises: a master latch circuit configured to receive an input data and generate a sampling data; an error detection circuit coupled to the master latch circuit to compare the input data with the sampling data to generate a comparison result; a multiplexer coupled to the master latch circuit and the error detection circuit; and a slave latch circuit coupled to the multiplexer to receive a multiplexer output from the multiplexer and generate an output data, wherein, the multiplexer outputs the input data or the sampling data to the slave latch circuit according to the comparison result,
- a system error detection and correction circuit coupled to the pipeline circuit, wherein the system error detection and correction circuit comprises: a plurality of error state reception units, each receiving an error state signal from the error detection circuit; a plurality of continuous error state detection units coupled to adjacent error state reception units with continuous stages; a global system error detection unit coupled to the continuous error state detection units; and an interruption controller coupled to the global system error detection unit to interrupt and re-activate the pipeline circuit;
- when the continuous error state detection units detect continuous error states, the continuous error state detection units notify the global system error detection unit, the global system error detection unit stops all the operations of all pipeline stage circuits through the interruption controller and flushes the data of the pipeline stage circuits, and the pipeline circuit is re-activated at a second operating frequency, wherein the second operating frequency is lower than first operating frequency; and
- when the input data is identical to the sampling data, the multiplexer outputs the sampling data to the slave latch circuit; and, when the input data is different from the sampling data, the multiplexer outputs the input data to the slave latch circuit.

8. The error detection and correction system according to claim 7, wherein,
- each of the first and second error detection and correction circuits further comprises: a frequency division circuit coupled to the error detection circuit to output a plurality of clock frequency division signals according to a clock signal and output the clock frequency division signals to the error detection circuit, the master latch circuit and the slave latch circuit;
- the master latch circuit and the slave latch circuit further receive a setting signal, the master latch circuit generates the sampling data according to the setting signal, and the slave latch circuit generates the output data; or, the master latch circuit and the slave latch circuit further receive a reset signal, the master latch circuit generates the sampling data according to the setting signal, and the slave latch circuit generates the output data; or the master latch circuit and the slave latch circuit further receive the setting signal and the reset signal, the master latch circuit generates the sampling data according to the setting signal and the reset signal, and the slave latch circuit generates the output data.

* * * * *